US007238572B2

(12) United States Patent
Jeon et al.

(10) Patent No.: US 7,238,572 B2
(45) Date of Patent: Jul. 3, 2007

(54) METHOD OF MANUFACTURING EEPROM CELL

(75) Inventors: Hee-seog Jeon, Hwaseong-si (KR); Seung-beom Yoon, Suwon-si (KR); Yong-tae Kim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 334 days.

(21) Appl. No.: 11/096,038

(22) Filed: Mar. 31, 2005

(65) Prior Publication Data
US 2005/0245031 A1 Nov. 3, 2005

(30) Foreign Application Priority Data
Apr. 30, 2004 (KR) ............... 10-2004-0030473

(51) Int. Cl.
*H01L 21/336* (2006.01)
(52) U.S. Cl. ................... 438/258; 257/E21.69
(58) Field of Classification Search .......... 438/211, 438/258, 266, 594; 257/E21.69
See application file for complete search history.

(56) References Cited

U.S. PATENT DOCUMENTS

| 5,541,129 | A | | 7/1996 | Tsunoda | ............... 437/43 |
| 5,981,340 | A | * | 11/1999 | Chang et al. | ............... 438/258 |
| 6,316,293 | B1 | * | 11/2001 | Fang | ............... 438/142 |
| 6,506,646 | B1 | * | 1/2003 | Miyagi | ............... 438/257 |

FOREIGN PATENT DOCUMENTS

KR 10-0267870 10/2000

* cited by examiner

*Primary Examiner*—Chandra Chaudhari
(74) *Attorney, Agent, or Firm*—Mills & Onello LLP

(57) ABSTRACT

A method of manufacturing an EEPROM cell includes growing a first oxide layer on a semiconductor substrate; forming a first conductive layer on the first oxide layer; forming a first conductive pattern and a tunneling oxide layer by patterning the first conductive layer and the first oxide layer, the tunneling oxide layer being disposed under the first conductive pattern; forming a gate oxide layer on sidewalls of the first conductive pattern and the substrate and forming a second conductive pattern on both sides of the first conductive pattern; forming a conductive layer for a floating gate by electrically connecting the first conductive pattern to the second conductive pattern; forming a coupling oxide layer on the conductive layer for the floating gate; forming a third conductive layer on the coupling oxide layer; and forming a select transistor and a control transistor by patterning the third conductive layer, the coupling oxide layer, and the conductive layer for the floating gate. The select transistor is spaced apart from the control transistor. The select transistor, which is formed on the tunneling oxide layer, includes a gate stack formed of a select gate, a first coupling oxide pattern, and a first floating gate, and the control transistor includes a gate stack formed of a control gate, a second coupling oxide pattern, and a second floating gate.

17 Claims, 7 Drawing Sheets

METHOD OF MANUFACTURING EEPROM CELL

This application claims the priority of Korean Patent Application No. 2004-30473, filed on Apr. 30, 2004, in the Korean Intellectual Property Office, the disclosure of which is incorporated herein in its entirety by reference.

BACKGROUND OF THE INVENTION

1. Field of the Invention

The present invention relates to a method of manufacturing an electrically erasable programmable read only memory (EEPROM) cell, and more particularly, to a method of manufacturing an EEPROM cell, which forms a tunneling oxide layer using an improved process so as to enhance the write/erase efficiency of the EEPROM cell.

2. Description of the Related Art

A typical EEPROM cell includes a floating gate, a select gate, a tunneling oxide layer, a coupling oxide layer, a control gate, and a bit line. The floating gate stores charge in the form of electrons, and the select gate is formed on the floating gate to control the floating gate. The tunneling oxide layer functions as a path through which electrons are moved based on the Fowler-Nordheim tunneling (F-N tunneling) mechanism during a write or erase operation. The coupling oxide layer transmits a voltage applied to the select gate to the floating gate. The control gate transmits a bit line voltage during the write or erase operation. The bit line transmits data.

During a read or write operation, the control gate transmits data from the bit line to a cell or transmits data from the cell to the bit line. Since this control gate is connected to several cells orthogonal to the bit line and includes one or more words, it is referred to as a word line. The coupling oxide layer, which is formed on the floating gate, couples the voltage applied to the select gate during an erase operation to elevate the electric potential of the floating gate. In a typical EEPROM cell, an oxide-nitride-oxide (ONO) layer is used as a coupling oxide layer. Under the floating gate, a thick oxide region and a thin oxide region (i.e., a tunneling oxide region) are disposed. The thick oxide region reduces the coupling ratio between the voltage applied from the bit line and the voltage of the floating gate to maintain a large electric potential therebetween. Also, the thin oxide region functions as a path through which electrons move based on the F-N tunneling mechanism during a write or erase operation.

Hereinafter, a method of manufacturing a conventional EEPROM cell will be described with reference to FIGS. 1 through 5.

Referring to FIG. 1, a thick oxide layer 11 is grown on a silicon substrate 10 to a thickness of about 250 Å.

Referring to FIG. 2, a first photoresist mask 12 is formed such that the substrate 10 and the thick oxide layer 11 are exposed in a predetermined region. Impurity ions 13 are implanted into the exposed portion, thereby forming a floating junction 14 in the substrate 10. Then, the first photoresist mask 12 is removed.

Referring to FIG. 3, a second photoresist mask 16 is formed on the thick oxide layer 11 to define a tunneling oxide layer forming region 15. The thick oxide layer 11 in the tunneling oxide layer forming region 15 is wet etched using the second photoresist mask 16 as an etch mask so as to expose the floating junction 14. Then, the second photoresist mask 16 is removed.

Thereafter, a thin oxide layer is grown in the tunneling oxide layer forming region 15, thereby forming a tunneling oxide layer 17 as shown in FIG. 4. Over the substrate 10 on which the tunneling oxide layer 17 is formed, a first polysilicon layer 18 for a floating gate is formed. A coupling oxide layer 19, for example, an ONO layer, is formed thereon, and a second polysilicon layer 20 is formed to an appropriate thickness.

The second polysilicon layer 20, the ONO layer 19, and the first polysilicon layer 18 are patterned using a photolithography process. As a result, referring to FIG. 5, a select transistor S and a control transistor C are formed. The select transistor has a gate stack, which includes a select gate 20a, an ONO pattern 19a, and a floating gate 18a, and the control transistor C has a gate stack, which includes a control gate 20b, an ONO pattern 19b, and a floating gate 18b. Thereafter, an appropriate ion implantation process is performed to form a cell source junction 21 and a bit line junction 22. Consequently, an EEPROM cell is completed.

However, in the conventional EEPROM cell, the tunneling oxide layer 17 is formed on a portion of the substrate 10 from which a portion of the thick oxide layer 11 is removed using wet etching. Accordingly, the tunneling oxide layer 17 is not actually formed to the same size as that of the tunneling oxide layer forming region 15 defined by the second photoresist mask 16 and at a predetermined thickness. This is because after the thick oxide layer 11 is wet etched, not only the exposed portion in the tunneling oxide layer forming region 15 is etched, but also an adjacent region can be over-etched or an undercut can be formed. As shown in FIG. 6, which is an exploded view of the select transistor S shown in FIG. 5, the resultant tunneling oxide layer 17 has a greater size B than a size A of the tunneling oxide layer forming region 15 defined in FIG. 5. Also, an etching profile obtained by wet etching the thick oxide layer 11 is inclined so that the thickness of the tunneling oxide layer 17 is greater near the edge portions than in the center portion. Thus, the coupling ratio is reduced, which can deteriorate the write/erase efficiency of the EEPROM cell.

In general, the coupling ratio is a factor that determines the voltage that is to be applied to the tunneling oxide layer 17 during a write or erase operation. The voltage applied to the tunneling oxide layer 17 during a write operation (i.e., $V_{tun}(\text{write})$) and the voltage applied to the tunneling oxide layer 17 during an erase operation (i.e., $V_{tun}(\text{erase})$) are expressed as shown in Equations 1 and 2.

$$V_{tun}(\text{write}) = V_{fg} + K_w \times V_{bl} \quad (1)$$

$$V_{tun}(\text{erase}) = V_{fg} + K_e \times V_{sl} \quad (2)$$

Herein, $V_{fg}$ refers to a voltage applied to the floating gate 18a, $K_w$ refers to a coupling ratio during a write operation, $V_{bl}$ refers to a bit line voltage, $K_e$ refers to a coupling ratio during an erase operation, and $V_{sl}$ is a voltage applied to the select gate 20a. $K_w$ and $K_e$ are expressed as shown in Equation 3.

$$K_w = 1 - C_{tun}/(C_{ono} + C_{gox} + C_{tun})$$

$$K_e = C_{ono}/(C_{ono} + C_{gox} + C_{tun}) \quad (3)$$

Herein, $C_{ono}$ refers to the capacitance of the ONO pattern 19a, $C_{gox}$ refers to the capacitance of the thick oxide layer 11, and $C_{tun}$ refers to the capacitance of the tunneling oxide layer 17.

As can be seen from Equations 1, 2, and 3, the coupling ratio depends on the capacitance of a capacitor constituting the select transistor S. As a capacitance $C_{tun}$ increases, both $K_w$ and $K_e$ decrease to lower write/erase efficiency. To prevent this problem, it is required to form the tunneling oxide layer 17 to a small size and thickness. However, in the conventional method using wet etching, the tunneling oxide layer 17 is formed to a relatively large size and thickness to reduce the coupling ratio. As a result, write/erase efficiency is deteriorated.

Also, when the tunneling oxide layer 17 is formed to a large size, the overlap margin between the tunneling oxide layer 17 and the floating junction 14 decreases so that the resulting cell size cannot be sufficiently reduced. Further, if a boundary of the floating junction 14 is positioned under the tunneling oxide layer 17 due to the small overlap margin, the EEPROM cell becomes unreliable due to band-to-band tunneling (BTBT).

SUMMARY OF THE INVENTION

The present invention provides a method of manufacturing an electrically erasable programmable ROM (EEPROM) cell, which improves a method of forming a tunneling oxide layer so as to enhance the write/erase efficiency of an EEPROM cell.

According to an aspect of the present invention, there is provided a method of manufacturing an EEPROM cell. The method includes growing a first oxide layer on a semiconductor substrate; forming a first conductive layer on the first oxide layer; forming a first conductive pattern and a tunneling oxide layer by patterning the first conductive layer and the first oxide layer, the tunneling oxide layer being disposed under the first conductive pattern; forming a gate oxide layer on sidewalls of the first conductive pattern and the substrate and forming a second conductive pattern on both sides of the first conductive pattern; forming a conductive layer for a floating gate by electrically connecting the first conductive pattern to the second conductive pattern; forming a coupling oxide layer on the conductive layer for the floating gate; forming a third conductive layer on the coupling oxide layer; and forming a select transistor and a control transistor by patterning the third conductive layer, the coupling oxide layer, and the conductive layer for the floating gate, wherein the select transistor is spaced apart from the control transistor, wherein the select transistor is formed on the tunneling oxide layer and includes a gate stack formed of a select gate, a first coupling oxide pattern, and a first floating gate, and wherein the control transistor includes a gate stack formed of a control gate, a second coupling oxide pattern, and a second floating gate.

In one embodiment, the forming of the first conductive pattern and the tunneling oxide layer comprises: forming a mask layer on the first conductive layer, the mask layer defining a tunneling oxide layer forming region; selectively growing a mask oxide layer in the tunneling oxide layer forming region using the mask layer as an oxidation mask; removing the mask layer and forming a first conductive pattern by etching the first conductive layer using the mask oxide layer as an etch mask; and forming a tunneling oxide layer under the first conductive pattern by wet etching the mask oxide layer disposed on the first conductive pattern and the first oxide layer disposed on the substrate.

In another embodiment, the method further comprises forming a floating junction in the substrate, wherein the tunneling oxide layer forming region is defined in a position corresponding to the floating junction, and further comprising: forming a cell source junction in a portion of the substrate opposite the floating junction in the select transistor; forming a lightly doped bit line junction in the substrate in a region of the control transistor; forming spacers on sidewalls of the gate stack of each of the select transistor and the control transistor; and forming a heavily doped bit line junction in a portion of the substrate opposite to the floating junction in the lightly doped bit line junction.

In another embodiment, the mask oxide layer is formed to a thickness of about 50 to 300 Å.

In another embodiment, the forming of the gate oxide layer and the second conductive pattern comprises: forming a second oxide layer on the resultant structure where the tunneling oxide layer is formed; forming a second conductive layer on the second oxide layer; forming a second conductive pattern on both sides of the first conductive pattern by planarizing the second conductive layer until the second oxide layer disposed on the first conductive pattern is exposed; and forming a gate oxide layer between the second conductive pattern and the first conductive pattern by wet etching the second oxide layer exposed on the first conductive pattern.

In another embodiment, the forming of the gate oxide layer comprises forming a gate oxide layer between the second conductive pattern and the first conductive pattern and exposing portions of a top surface and upper sidewalls of the first conductive pattern by removing the second oxide layer from the portions of the top surface and the upper sidewalls of the first conductive pattern.

In another embodiment, the first oxide layer is formed to a thickness of about 30 to 100 Å, the first conductive layer is formed to a thickness of about 300 to 1000 Å, the second conductive pattern is formed to a thickness of about 1000 to 2000 Å, and the gate oxide layer is formed to a thickness of about 100 to 300 Å.

In another embodiment, the method further comprises forming an additional conductive layer to a thickness of about 500 to 1500 Å to electrically connect the first conductive pattern and the second conductive pattern.

In another embodiment, the mask layer is formed of silicon nitride.

In another embodiment, each of the first conductive layer, the second conductive pattern, and the third conductive layer is formed of one selected from the group consisting of doped polysilicon, silicide, and a combination thereof.

According to another aspect of the present invention, there is provided a method of manufacturing an EEPROM cell. The method includes growing a first oxide layer on a semiconductor substrate; forming a first conductive layer on the first oxide layer; forming a first conductive pattern and a tunneling oxide layer by patterning the first conductive layer and the first oxide layer, the tunneling oxide layer being disposed under the first conductive pattern; forming a gate oxide layer on sidewalls of the first conductive pattern and the substrate; forming a conductive layer for a floating gate by forming a second conductive layer on the gate oxide layer, the second conductive layer being electrically connected to the first conductive pattern; forming a coupling oxide layer on the conductive layer for the floating gate; forming a third conductive layer on the coupling oxide layer; and forming a select transistor and a control transistor by patterning the third conductive layer, the coupling oxide layer, and the conductive layer for the floating gate, wherein the select transistor is spaced apart from the control transistor, wherein the select transistor is formed on the tunneling oxide layer and includes a gate stack formed of a select gate, a first coupling oxide pattern, and a first floating gate, and wherein the control transistor includes a gate stack formed of a control gate, a second coupling oxide pattern, and a second floating gate.

In one embodiment, the forming of the first conductive pattern and the tunneling oxide layer comprises: forming a mask layer on the first conductive layer; forming a photoresist pattern on the mask layer to cover a tunneling oxide layer forming region; forming a mask pattern and a first conductive pattern by etching the mask layer and the first conductive layer using the photoresist pattern as an etch mask; removing the photoresist pattern; and forming a tunneling oxide layer under the first conductive pattern by wet etching the first oxide layer exposed on the substrate.

In another embodiment, the method further comprises forming a floating junction in the substrate, wherein the tunneling oxide layer forming region is defined in a position corresponding to the floating junction, and further comprising: forming a cell source junction in a portion of the substrate opposite the floating junction in the select transistor; forming a lightly doped bit line junction in the substrate in a region of the control transistor; forming spacers on sidewalls of the gate stack of each of the select transistor and the control transistor; and forming a heavily doped bit line junction in a portion of the substrate opposite to the floating junction in the lightly doped bit line junction.

In another embodiment, the forming of the gate oxide layer is performed by thermally oxidizing the sidewalls of the first conductive pattern and the substrate.

In another embodiment, the first oxide layer is formed to a thickness of about 30 to 100 Å, the first conductive layer is formed to a thickness of about 200 to 1000 Å, the mask layer is formed to a thickness of about 500 to 1000 Å, the gate oxide layer is formed to a thickness of about 100 to 300 Å, and the second conductive layer is formed to a thickness of about 500 to 1500 Å.

In another embodiment, the mask layer is formed of silicon nitride.

In another embodiment, each of the first conductive layer, the second conductive layer, and the third conductive layer is formed of one selected from the group consisting of doped polysilicon, silicide, and a combination thereof.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
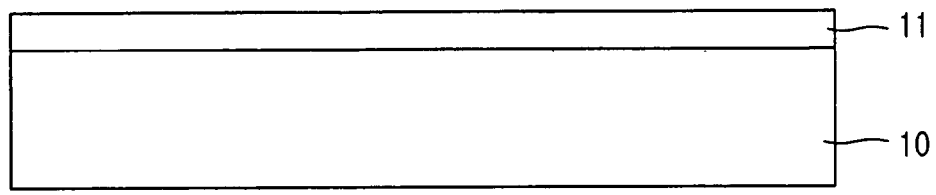
FIGS. 1 through 5 are cross-sectional views illustrating a process of manufacturing a conventional EEPROM cell.
Figure 2:
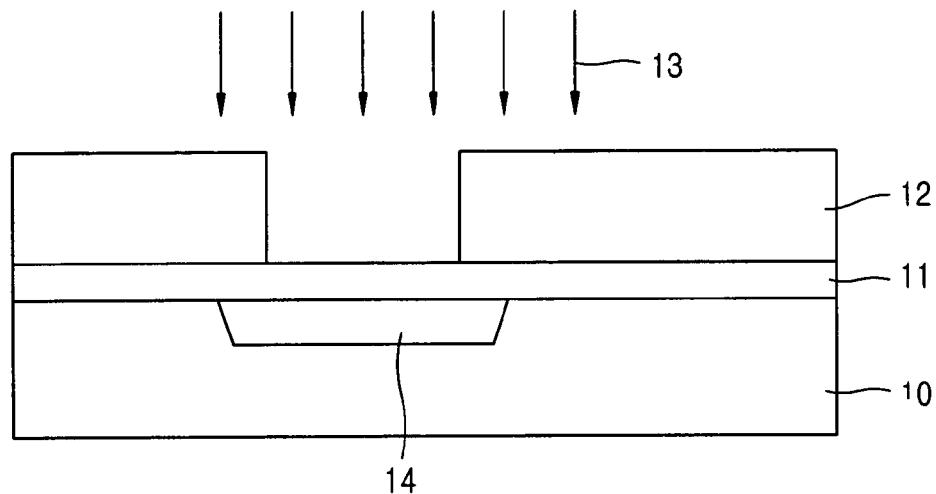
Figure 3:
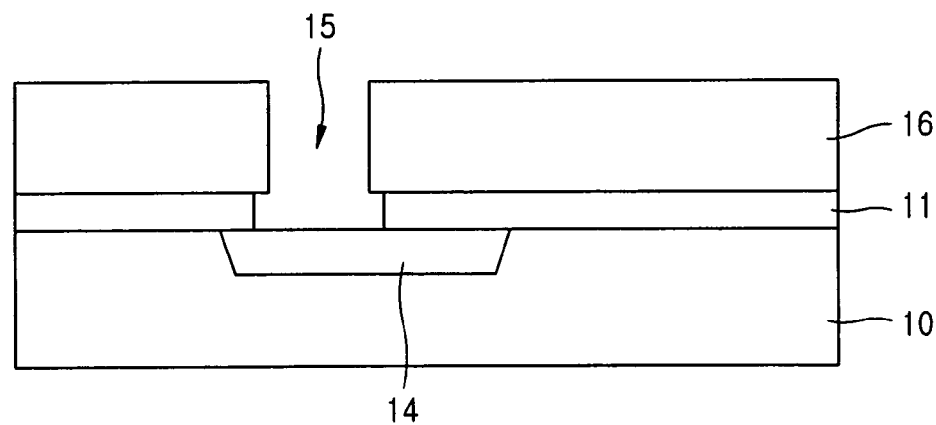
Figure 4:
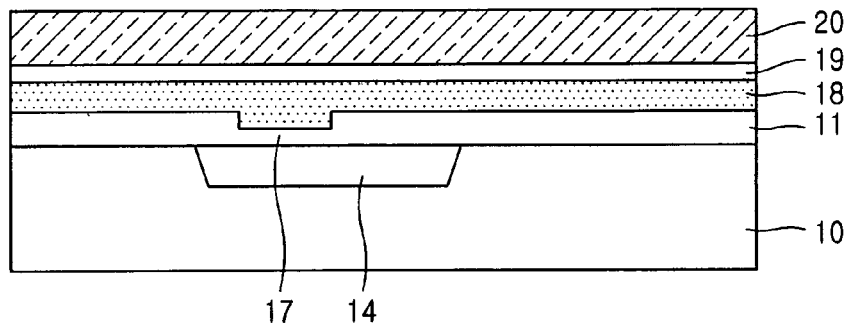
Figure 5:
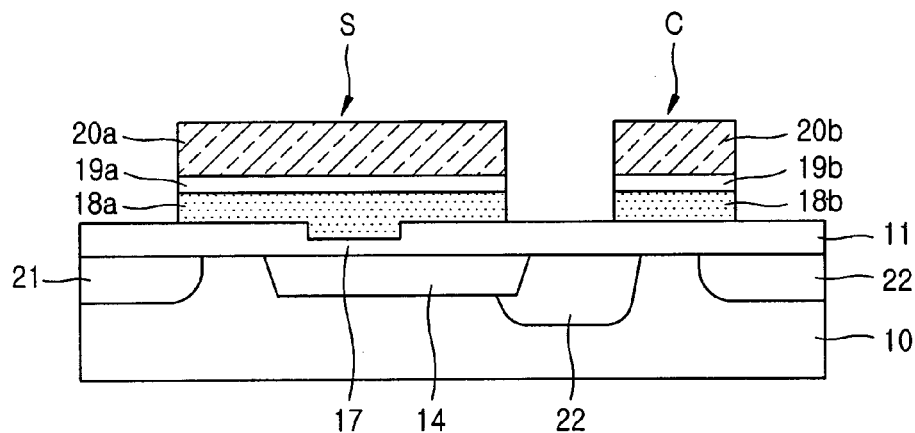
Figure 6:
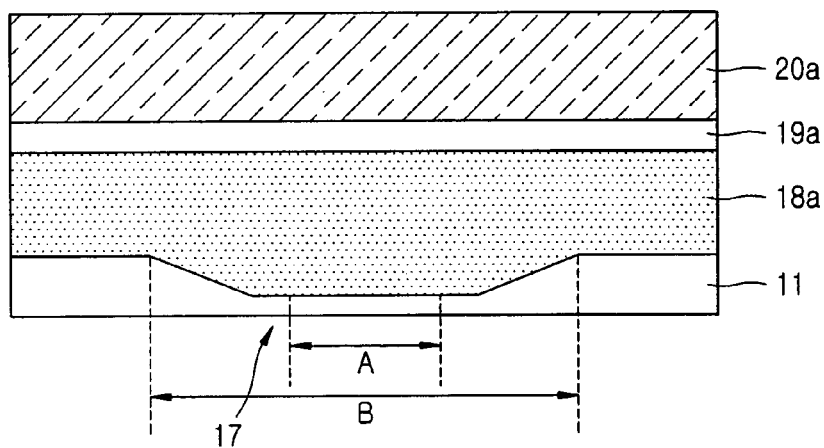
FIG. 6 is an exploded view of a select transistor of the conventional EEPROM cell shown in FIG. 5.

The present invention will now be described more fully with reference to the accompanying drawings, in which exemplary embodiments of the invention are shown. This invention may, however, be embodied in different forms and should not be construed as being limited to the embodiments set forth herein. Rather, these embodiments are provided so that this disclosure will be thorough and complete, and will fully convey the scope of the invention to those skilled in the art. To facilitate understanding, identical reference numerals have been used, where possible, to designate identical elements that are common to the figures.

FIGS. 7 through 15 are cross-sectional views illustrating a process of manufacturing an EEPROM cell according to an embodiment of the present invention.

Figure 7:
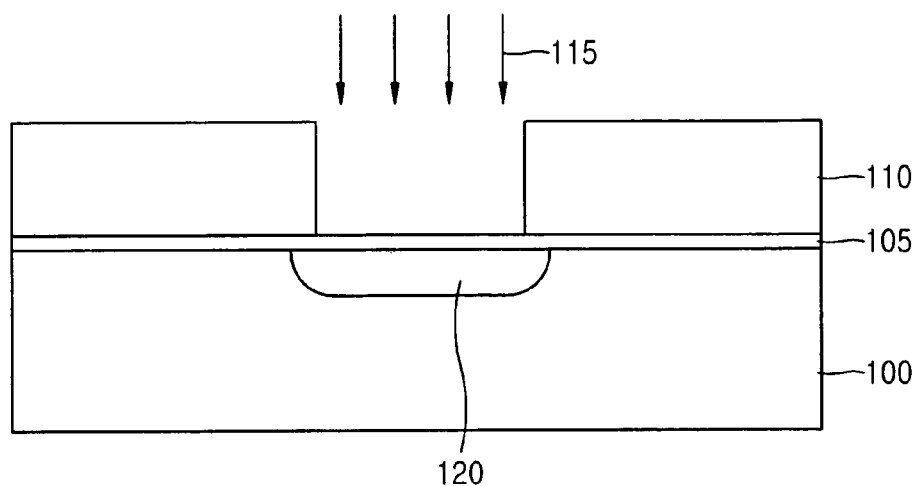
FIGS. 7 through 15 are cross-sectional views illustrating a process of manufacturing an EEPROM cell according to an embodiment of the present invention.

Referring to FIG. 7, an appropriate shallow trench isolation (STI) process (not shown) is performed on a semiconductor substrate 100, for example, a p-type silicon substrate. Thereafter, a buffer oxide layer 105 is thermally grown on the substrate 100 to a thickness of about 50 to 150 Å. A photoresist mask 110 is formed on the buffer oxide layer 105 such that the substrate 100 and the buffer oxide layer 105 are exposed in a predetermined region. Impurity ions, for example, n-type impurity ions 115 are doped using the photoresist mask 110 as an ion implantation mask, thereby forming a floating junction 120 in the substrate 100.

Figure 8:
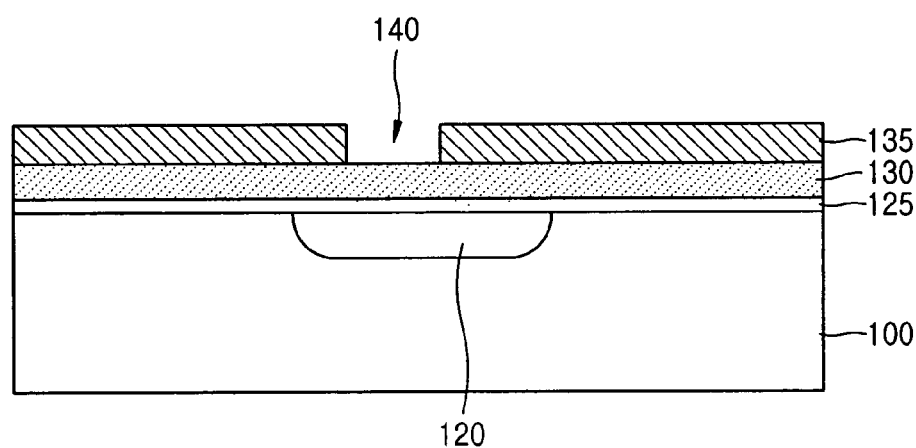

Referring to FIG. 8, the photoresist mask 110 is removed, and then the buffer oxide layer 105 is removed from the substrate 100. The buffer oxide layer 105 may be removed using, for example, a diluted HF (DHF) mixing HF and deionized water (DIW) in a ratio of 1:5-1000 or a buffered oxide etchant (BOE). A first oxide layer 125 is grown on the substrate 100 to a thickness of about 30 to 100 Å, preferably 50 to 100 Å, and a first conductive layer 130 is formed thereon to a thickness of about 300 to 1000 Å.

The first conductive layer 130 may be formed of, for example, doped polysilicon. A mask layer 135 is formed on the first conductive layer 130 to a thickness of about 1000 Å. Thereafter, the mask layer 135 is etched using a photolithography process, thereby defining a tunneling oxide layer forming region 140. Here, the tunneling oxide layer forming region 140 is defined in a position corresponding to the floating junction 120.

The first conductive layer 130 may be formed of silicide or a combination of doped polysilicon and silicide (i.e., polycide) in addition to doped polysilicon. To form the first conductive layer 130 using doped polysilicon, a polysilicon layer may be deposited and doped in situ at the same time. Alternatively, an undoped polysilicon layer may be deposited and then doped with impurity ions at a later time. Here, the polysilicon layer may be doped with n-type impurity ions, such as phosphorus (P) ions, at an energy of about 30 KeV at a dose of about $2.7 \times 10^{14}$ ions/cm$^2$. The mask layer 135 may be formed of silicon nitride at a temperature of about 500 to 850° C. using low pressure CVD (LPCVD) using a reaction between $SiH_4$ and $NH_3$. To define the tunneling oxide layer forming region 140, the mask layer 135 formed of silicon nitride may be etched using fluorocarbon-based gas, for example, $C_xF_y$ gas and $C_aH_bF_c$ gas, such as $CF_4$, $CHF_3$, $C_2F_6$, $C_4F_8$, $CH_2F_2$, $CH_3F$, $CH_4$, $C_2H_2$, $C_4F_6$, and any mixture thereof. Also, an Ar gas may be used as an atmospheric gas.

Figure 9:
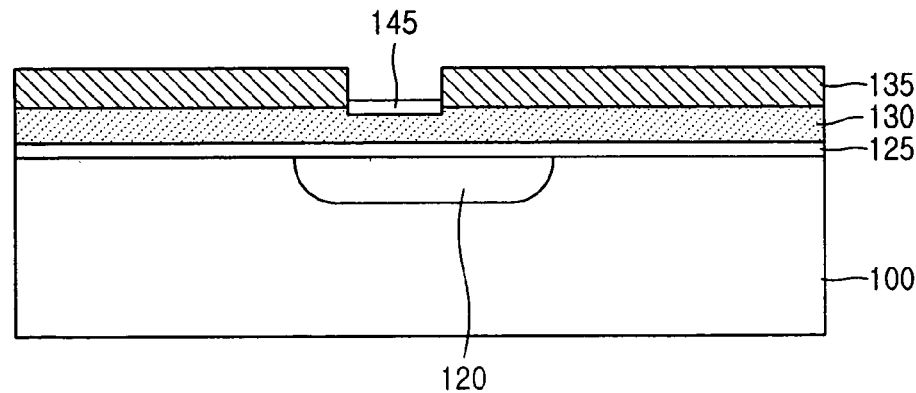

Referring to FIG. 9, by using the mask layer 135 as an oxidation mask, a mask oxide layer 145 is selectively grown to a thickness of about 50 to 300 Å in the tunneling oxide layer forming region 140.

Figure 10:
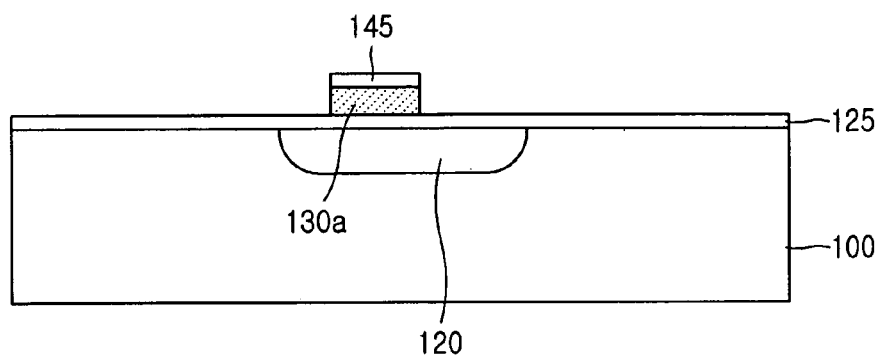

Referring to FIG. 10, the mask layer 135 is removed, and the first conductive layer 130 is etched using the mask oxide layer 145 as an etch mask, thereby forming a first conductive pattern 130a. The mask layer 135, which is formed of silicon nitride, may be removed using a phosphoric acid ($H_3PO_4$) strip. Also, the first conductive layer 130, which is formed of, for example, doped polysilicon, may be etched using a gas mixture of HBr, He, $O_2$, $N_2$, and $CF_4$. Here, a bias may be applied toward the substrate 100 to orient the direction of the etch gas.

Figure 11:
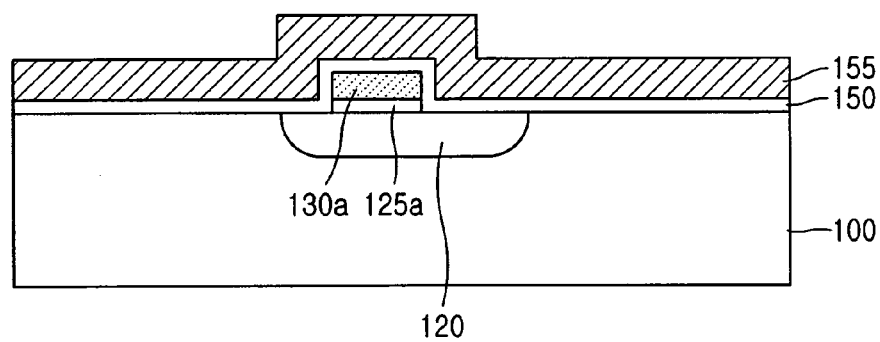

Referring to FIG. 11, the mask oxide layer 145 disposed on the first conductive pattern 130a and the first oxide layer 125 disposed on the substrate 100 are wet etched using DHF or BOE. Then, the tunneling oxide layer 125a is formed only under the first conductive pattern 130a. The tunneling oxide layer 125a is formed to a desired uniform thickness. As described above, in a conventional method, because a tunneling oxide layer forming region is defined by wet etching, an undercut is formed, which can increase the width and of the resulting tunneling oxide layer. However, in the case of the present invention, the size of the cell can be reduced without such a drawback. Also, in the present embodiment, since the capacitance of the tunneling oxide layer 125a is not increased by an isotropic etching profile formed by wet etching, write/erase efficiency can be maintained at a high level due to an increased coupling ratio. Thereafter, a second oxide layer 150 is formed on the entire surface of the substrate 100 to a thickness of about 100 to 300 Å, preferably 150 to 300 Å, and a second conductive layer 155 is formed thereon to a thickness of about 1000 to 2000 Å. The second conductive layer 155 may be formed of, for example, doped polysilicon. The second oxide layer 150 may be deposited using CVD, sub-atmospheric CVD, (SACVD), LPCVD, or plasma enhanced CVD (PECVD) or grown using thermal oxidation.

When the second oxide layer 150 is formed using CVD, a middle temperature oxide (MTO) layer may be optionally formed using $SiH_4$ gas (or $Si_2H_6$ gas) and $N_2O$ gas as a reactive gas. The second conductive layer 155 can be formed of silicide or a combination of doped polysilicon and silicide (i.e., polycide) in addition to doped polysilicon. The second conductive layer 155 can be formed of the same material as the first conductive layer 130 or a different material from the second conductive layer 130.

Figure 12:
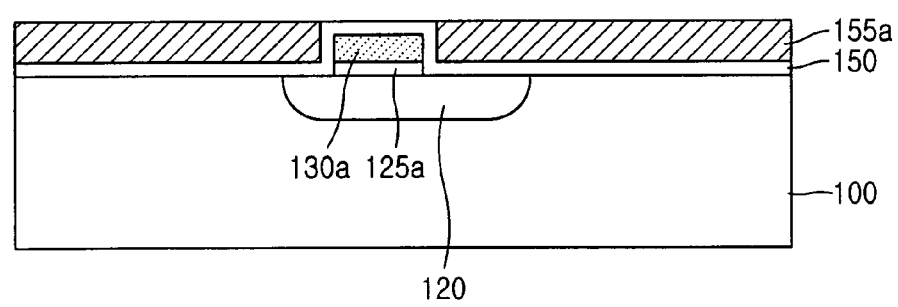

Referring to FIG. 12, the second conductive layer 155 is planarized using chemical mechanical polishing (CMP) until the second oxide layer 150 is exposed on the first conductive pattern 130a, thereby forming a second conductive pattern 155a on both sides of the first conductive pattern 130a.

Figure 13:
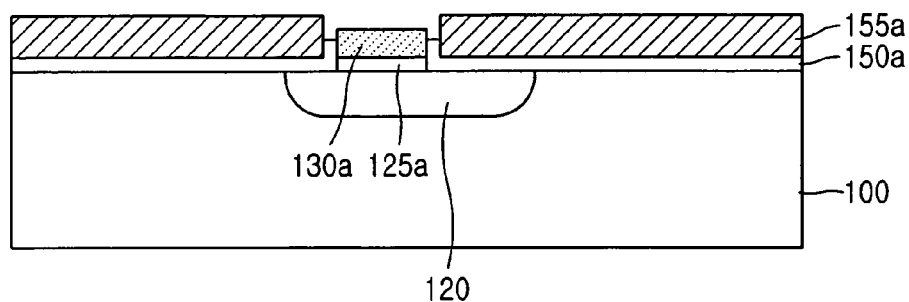
Figure 14:
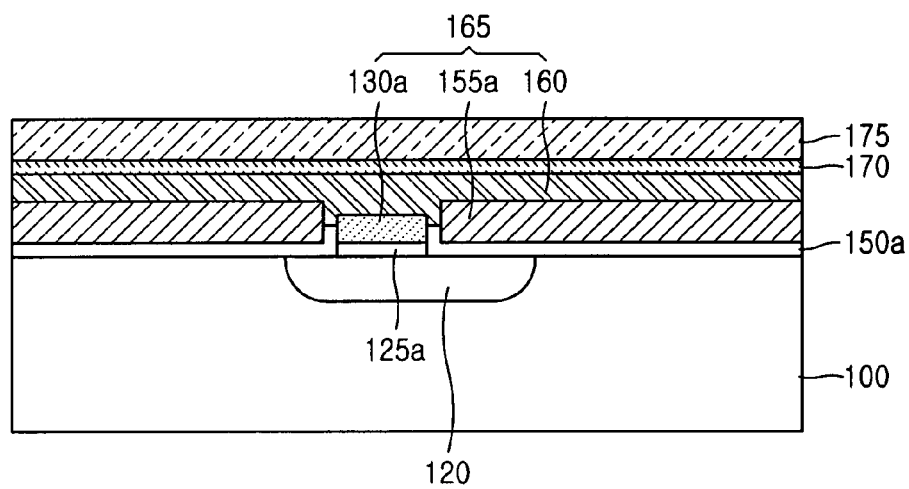
Figure 15:
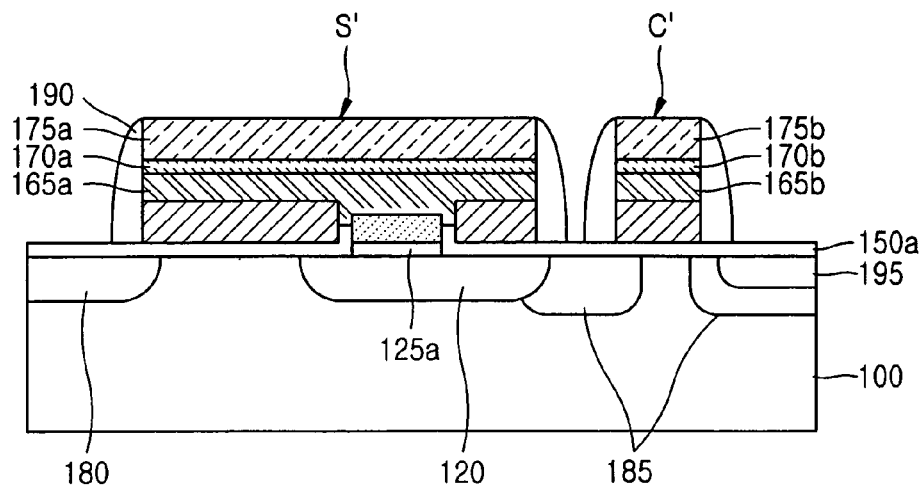

Referring to FIG. 13, the exposed second oxide layer 150 is wet etched to remove portions of the second oxide layer 150 disposed on a top surface and upper sidewalls of the first conductive pattern 135a. Thus, a gate oxide layer 150a is formed between the second conductive pattern 155a and the first conductive pattern 130a, and portions of the top surface and upper sidewalls of the first conductive pattern 135a are exposed. The gate oxide layer 150a, which is formed on the sidewalls of the first conductive pattern 130a defining the tunneling oxide layer 125a, can alleviate problems caused by a reduction in tunneling capacitance and degradation of characteristics due to band-to-band tunneling (BTBT).

Thereafter, a conductive layer 160, for example, a doped polysilicon layer, is formed on the resultant structure to a thickness of about 500 to 1500 Å to electrically connect the first conductive pattern 130a and the second conductive pattern 155a. Thus, a conductive layer 165 for a floating gate is completed. Then, a coupling oxide layer 170, for example, an oxide-nitride-oxide (ONO) layer, is formed on the conductive layer 165 for the floating gate, and a third conductive layer 175 is formed thereon to an appropriate thickness. The third conductive layer 175 may also be formed of doped polysilicon, silicide, or a combination thereof. The third conductive layer 175 may be formed of the same material as the first conductive layer 130, the second conductive layer 155, and/or the conductive layer 160 or a different material therefrom.

The third conductive layer 175, the coupling oxide layer 170, and the conductive layer 165 for the floating gate are patterned using a photolithography process. As a result, referring to FIG. 15, a select transistor S', which has a gate stack including a select gate 175a, a first coupling oxide pattern 170a and a first floating gate 165a, is formed on the tunneling oxide layer 125a. At the same time, a control transistor C', which has a gate stack including a control gate 175b, a second coupling oxide pattern 170b, and a second floating gate 165b, is formed apart from the select transistor S'.

Thereafter, high-concentration impurity ions, for example, n-type impurity ions are doped at a dose of about $1.0 \times 10^{15}$ to $1.0 \times 10^{16}$ ions/cm². Thus, a cell source junction 180 is formed in a portion of the substrate 100 opposite to the floating junction 120 in the select transistor S'. Also, a predetermined mask process is performed, thereby forming a lightly doped bit line junction 185 in the substrate 100 corresponding to the control transistor C'. A thin insulating layer is formed on the resultant structure, and spacers 190 are formed using reactive ion etching (RIE) on sidewalls of the gate stacks of the select transistor S' and the control transistor C'. Also, a high-concentration n-type ion implantation is performed, thereby forming a heavily doped bit line junction 195 in the lightly doped bit line junction 185 opposite to the floating junction 120.

As described above, in the present invention, after the tunneling oxide layer 125a is defined, the gate oxide layer 150a is formed. Thus, the tunneling oxide layer 125a can be formed to a desired size and thickness.

FIGS. 16 through 21 are cross-sectional views illustrating a method of manufacturing an EEPROM cell according to another embodiment of the present invention.

Figure 16:
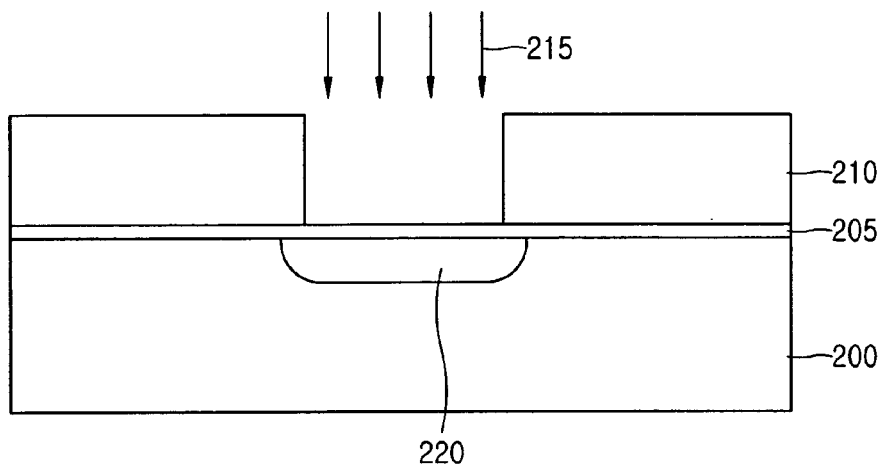
FIGS. 16 through 21 are cross-sectional views illustrating a process of manufacturing an EEPROM cell according to another embodiment of the present invention.

Referring to FIG. 16, an STI process is performed on a semiconductor substrate 200, for example, a p-type silicon substrate, and a buffer oxide layer 205 is thermally grown on the resultant structure. The buffer oxide layer 205 is formed to a thickness of about 50 to 200 Å, preferably 50 to 150 Å. A photoresist mask 210 is formed on the buffer oxide layer 205 such that the substrate 200 and the buffer oxide layer 205 are exposed in a predetermined region. By using the photoresist mask 210 as an ion implantation mask, impurity ions, for example, n-type impurity ions 215 are doped, thereby forming a floating junction 220 in the substrate 200.

Figure 17:
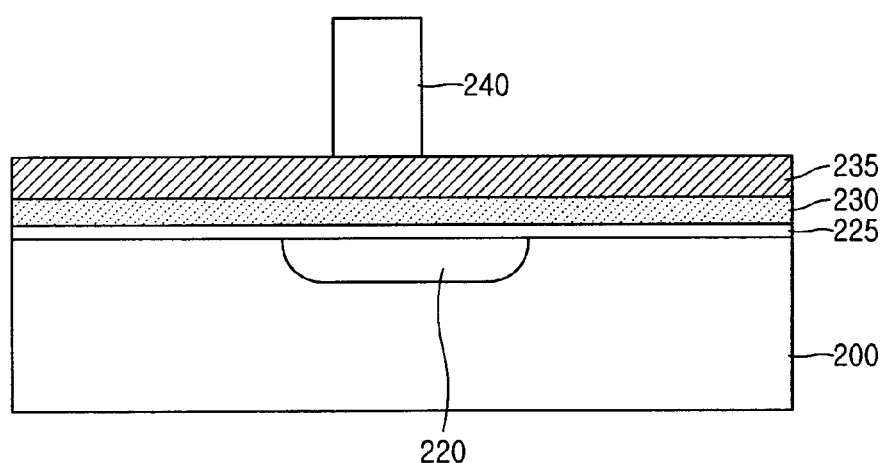

Referring to FIG. 17, the photoresist mask 210 is removed, and the buffer oxide layer 205 formed on the substrate 200 is also removed using DHF or BOE. A first oxide layer 225 is grown on the substrate 200 to a thickness of bout 30 to 100 Å, preferably 50 to 100 Å, and a first conductive layer 230 is formed thereon to a thickness of about 200 to 1000 Å. On the first conductive layer 230, a mask layer 235 is formed to a thickness of about 500 to 1000 Å. Then, a photoresist pattern 240 is formed to cover a tunneling oxide layer forming region. The mask layer 235 may be formed of, for example, silicon nitride.

Figure 18:
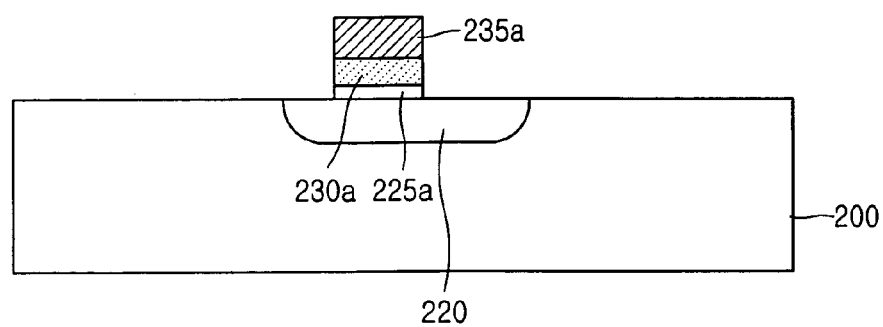

Referring to FIG. 18, the mask layer 235 and the first conductive layer 230 are etched using the photoresist pattern 240 as an etch mask. Thus, a mask pattern 235a and a first conductive pattern 230a are formed, and the photoresist pattern 240 is removed. The first oxide layer 225 exposed on the substrate 200 is wet etched using DHF or BOE so that a tunneling oxide layer 225a is formed under the first conductive pattern 230a. As described above, in a conventional method, when a tunneling oxide layer forming region is defined by wet etching, an undercut is formed, which can increase the size of the resulting tunneling oxide layer. However, in this case, the size of a cell can be reduced without such a limitation. Also, since the capacitance of the tunneling oxide layer is not increased by an isotropic etching profile formed by wet etching, write/erase efficiency can be maintained at a high level due to an increased coupling ratio.

Figure 19:
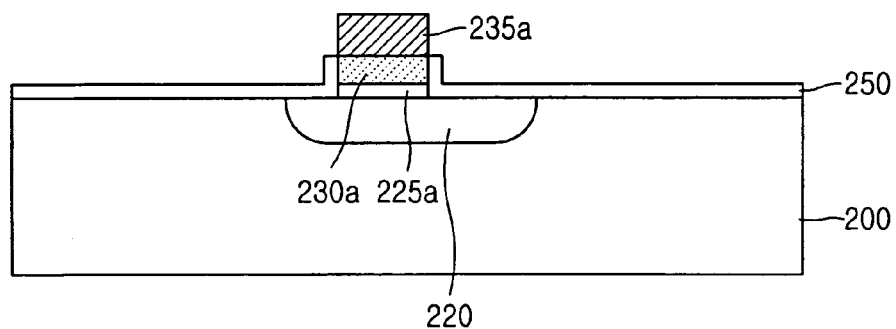

Referring to FIG. 19, a gate oxide layer 250 is grown on sidewalls of the first conductive pattern 230a and the exposed portion of the substrate 200. The gate oxide layer 250 may be formed to a thickness of about 100 to 300 Å. The gate oxide layer 250, which is formed on the sidewalls of the first conductive pattern 230a defining the tunneling oxide layer 225a, can alleviate problems caused by a reduction in tunneling capacitance and degradation of characteristics due to BTBT.

Figure 20:
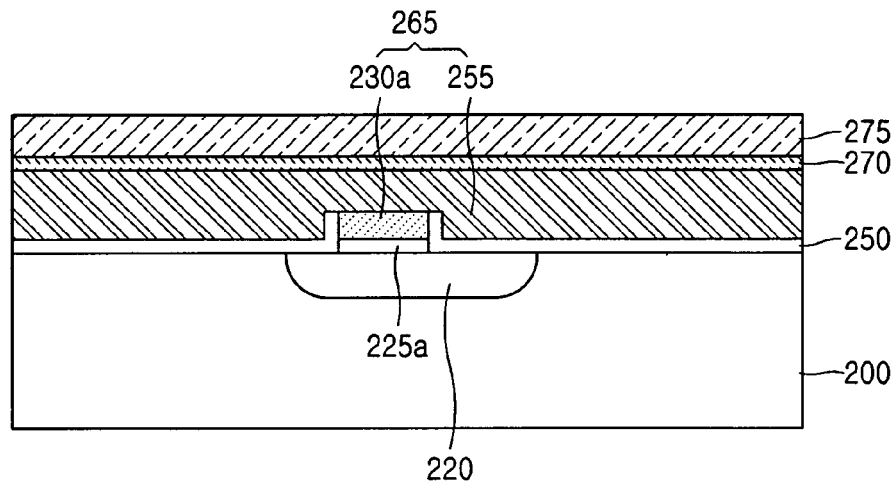
Figure 21:
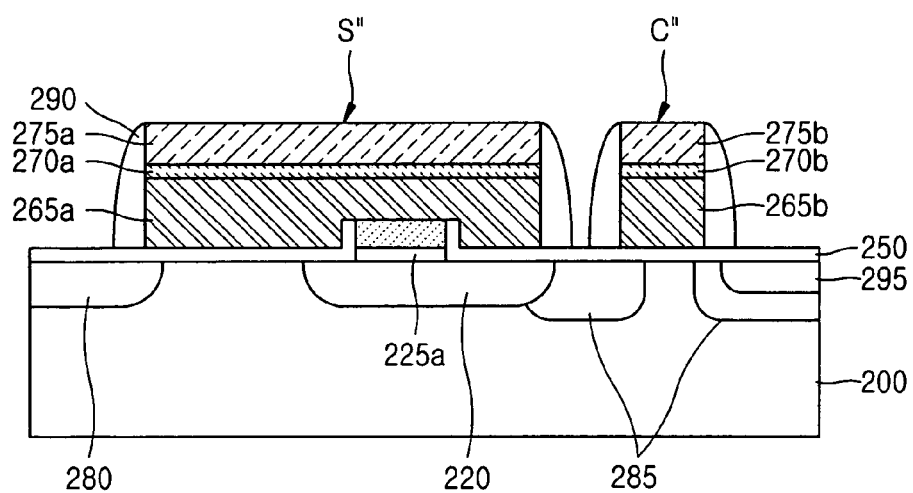

Referring to FIG. 20, the mask pattern 235a is wet etched such that a top surface of the first conductive pattern 230a is exposed, and a second conductive layer 255 is formed thereon to a thickness of about 500 to 1500 Å to electrically connect the first conductive pattern 230a and the second conductive layer 255. Thus, a conductive layer 265 for a floating gate is formed. On the resultant structure, a coupling oxide layer 270, for example, an ONO layer, and a third conductive layer 275 having an appropriate thickness are formed. The first conductive layer 230, the second conductive layer 255, and the third conductive layer 275 each may be formed of doped polysilicon, silicide, or a combination thereof.

The third conductive layer 275, the coupling oxide layer 270, and the conductive layer 265 for the floating gate are patterned by a photolithography process. As a result, referring to FIG. 21, a select transistor S", which has a gate stack including a select gate 275a, a first coupling oxide pattern 270a, and a first floating gate 265a, is formed on the tunneling oxide layer 225a. At the same time, a control transistor C", which has a gate stack including a control gate 275b, a second coupling oxide pattern 270b, and a second floating gate 265b, is formed apart from the select transistor S". Thereafter, high-concentration impurity ions, for example, n-type impurity ions, are doped to form a cell source junction 280 in the substrate 200. Then, a predetermined mask process is performed to form a lightly doped bit line junction 285 in the substrate 200. An insulating layer is formed on the resultant structure, and spacers 290 are formed using dry RIE on the gate stacks of the select transistor S" and the control transistor C". Also, high-concentration n-type impurity ions are doped to form a heavily doped bit line junction 295 in the lightly doped bit line junction 285.

As described above, unlike the conventional approach in which an undercut is formed when a tunneling oxide layer forming region is defined by wet etching, in the present invention, since the size of a tunneling oxide layer is not increased, a cell can be reliably reduced in scale. Also, according to the present invention, since the capacitance of the tunneling oxide layer is not increased by an isotropic etching profile formed by the wet etching, write/erase efficiency can be improved due to an increased coupling ratio.

Further, a thick oxide layer, which is grown on sidewalls of a polysilicon layer defining the tunneling oxide layer forming region, can alleviate problems which otherwise would be caused by a reduction in tunneling capacitance and deterioration of characteristics due to BTBT.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing an EEPROM cell, the method comprising:
   growing a first oxide layer on a semiconductor substrate;
   forming a first conductive layer on the first oxide layer;
   forming a first conductive pattern and a tunneling oxide layer by patterning the first conductive layer and the first oxide layer, the tunneling oxide layer being disposed under the first conductive pattern;
   forming a gate oxide layer on sidewalls of the first conductive pattern and the substrate and forming a second conductive pattern on both sides of the first conductive pattern;
   forming a conductive layer for a floating gate by electrically connecting the first conductive pattern to the second conductive pattern;
   forming a coupling oxide layer on the conductive layer for the floating gate;
   forming a third conductive layer on the coupling oxide layer; and
   forming a select transistor and a control transistor by patterning the third conductive layer, the coupling oxide layer, and the conductive layer for the floating gate, wherein the select transistor is spaced apart from the control transistor, wherein the select transistor is formed on the tunneling oxide layer and includes a gate stack formed of a select gate, a first coupling oxide pattern, and a first floating gate, and wherein the control transistor includes a gate stack formed of a control gate, a second coupling oxide pattern, and a second floating gate.

2. The method of claim 1, wherein the forming of the first conductive pattern and the tunneling oxide layer comprises:
   forming a mask layer on the first conductive layer, the mask layer defining a tunneling oxide layer forming region;
   selectively growing a mask oxide layer in the tunneling oxide layer forming region using the mask layer as an oxidation mask;
   removing the mask layer and forming a first conductive pattern by etching the first conductive layer using the mask oxide layer as an etch mask; and
   forming a tunneling oxide layer under the first conductive pattern by wet etching the mask oxide layer disposed on the first conductive pattern and the first oxide layer disposed on the substrate.

3. The method of claim 2, further comprising forming a floating junction in the substrate, wherein the tunneling oxide layer forming region is defined in a position corresponding to the floating junction,
   and further comprising:
   forming a cell source junction in a portion of the substrate opposite the floating junction in the select transistor;
   forming a lightly doped bit line junction in the substrate in a region of the control transistor;
   forming spacers on sidewalls of the gate stack of each of the select transistor and the control transistor; and
   forming a heavily doped bit line junction in a portion of the substrate opposite to the floating junction in the lightly doped bit line junction.

4. The method of claim 2, wherein the mask oxide layer is formed to a thickness of about 50 to 300 Å.

5. The method of claim 1, wherein the forming of the gate oxide layer and the second conductive pattern comprises:
   forming a second oxide layer on the resultant structure where the tunneling oxide layer is formed;

forming a second conductive layer on the second oxide layer;

forming a second conductive pattern on both sides of the first conductive pattern by planarizing the second conductive layer until the second oxide layer disposed on the first conductive pattern is exposed; and forming a gate oxide layer between the second conductive pattern and the first conductive pattern by wet etching the second oxide layer exposed on the first conductive pattern.

6. The method of claim 5, wherein the forming of the gate oxide layer comprises forming a gate oxide layer between the second conductive pattern and the first conductive pattern and exposing portions of a top surface and upper sidewalls of the first conductive pattern by removing the second oxide layer from the portions of the top surface and the upper sidewalls of the first conductive pattern.

7. The method of claim 1, wherein the first oxide layer is formed to a thickness of about 30 to 100 Å, the first conductive layer is formed to a thickness of about 300 to 1000 Å, the second conductive pattern is formed to a thickness of about 1000 to 2000 Å, and the gate oxide layer is formed to a thickness of about 100 to 300 Å.

8. The method of claim 1, further comprising forming an additional conductive layer to a thickness of about 500 to 1500 Å to electrically connect the first conductive pattern and the second conductive pattern.

9. The method of claim 1, wherein the mask layer is formed of silicon nitride.

10. The method of claim 1, wherein each of the first conductive layer, the second conductive pattern, and the third conductive layer is formed of one selected from the group consisting of doped polysilicon, silicide, and a combination thereof.

11. A method of manufacturing an EEPROM cell, the method comprising:

growing a first oxide layer on a semiconductor substrate;

forming a first conductive layer on the first oxide layer;

forming a first conductive pattern and a tunneling oxide layer by patterning the first conductive layer and the first oxide layer, the tunneling oxide layer being disposed under the first conductive pattern;

forming a gate oxide layer on sidewalls of the first conductive pattern and the substrate;

forming a conductive layer for a floating gate by forming a second conductive layer on the gate oxide layer, the second conductive layer being electrically connected to the first conductive pattern;

forming a coupling oxide layer on the conductive layer for the floating gate;

forming a third conductive layer on the coupling oxide layer; and forming a select transistor and a control transistor by patterning the third conductive layer, the coupling oxide layer, and the conductive layer for the floating gate, wherein the select transistor is spaced apart from the control transistor, wherein the select transistor is formed on the tunneling oxide layer and includes a gate stack formed of a select gate, a first coupling oxide pattern, and a first floating gate, and wherein the control transistor includes a gate stack formed of a control gate, a second coupling oxide pattern, and a second floating gate.

12. The method of claim 11, wherein the forming of the first conductive pattern and the tunneling oxide layer comprises:

forming a mask layer on the first conductive layer;

forming a photoresist pattern on the mask layer to cover a tunneling oxide layer forming region;

forming a mask pattern and a first conductive pattern by etching the mask layer and the first conductive layer using the photoresist pattern as an etch mask;

removing the photoresist pattern; and forming a tunneling oxide layer under the first conductive pattern by wet etching the first oxide layer exposed on the substrate.

13. The method of claim 12, further comprising forming a floating junction in the substrate, wherein the tunneling oxide layer forming region is defined in a position corresponding to the floating junction, and further comprising:

forming a cell source junction in a portion of the substrate opposite the floating junction in the select transistor;

forming a lightly doped bit line junction in the substrate in a region of the control transistor;

forming spacers on sidewalls of the gate stack of each of the select transistor and the control transistor; and forming a heavily doped bit line junction in a portion of the substrate opposite to the floating junction in the lightly doped bit line junction.

14. The method of claim 11, wherein the forming of the gate oxide layer is performed by thermally oxidizing the sidewalls of the first conductive pattern and the substrate.

15. The method of claim 11, wherein the first oxide layer is formed to a thickness of about 30 to 100 Å, the first conductive layer is formed to a thickness of about 200 to 1000 Å, the mask layer is formed to a thickness of about 500 to 1000 Å, the gate oxide layer is formed to a thickness of about 100 to 300 Å, and the second conductive layer is formed to a thickness of about 500 to 1500 Å.

16. The method of claim 11, wherein the mask layer is formed of silicon nitride.

17. The method of claim 11, wherein each of the first conductive layer, the second conductive layer, and the third conductive layer is formed of one selected from the group consisting of doped polysilicon, silicide, and a combination thereof.

* * * * *